US008809995B2

(12) United States Patent
Duan et al.

(10) Patent No.: US 8,809,995 B2
(45) Date of Patent: Aug. 19, 2014

(54) THROUGH SILICON VIA NOISE SUPPRESSION USING BURIED INTERFACE CONTACTS

(75) Inventors: Xiaomin Duan, Hamburg (DE); Xiaoxiong Gu, White Plains, NY (US); Yong Liu, Rye, NY (US); Joel A. Silberman, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 67 days.

(21) Appl. No.: 13/408,300

(22) Filed: Feb. 29, 2012

(65) Prior Publication Data

US 2013/0221484 A1    Aug. 29, 2013

(51) Int. Cl.
*H01L 23/528* (2006.01)

(52) U.S. Cl.
USPC ............... 257/508; 257/774; 257/E23.011; 257/E21.597; 438/667

(58) Field of Classification Search
CPC ............ H01L 23/481; H01L 21/486; H01L 21/76898; H01L 2225/06541; H01L 23/49827
USPC .......... 257/508, 774, 698, E23.011, E21.597; 438/667
See application file for complete search history.

(56) References Cited

U.S. PATENT DOCUMENTS

| 6,531,753 B1* | 3/2003 | Lin ............................... 257/508 |
| 7,427,803 B2 | 9/2008 | Chao et al. |
| 7,851,893 B2 | 12/2010 | Kim et al. |
| 7,986,042 B2 | 7/2011 | Or-Bach et al. |
| 2006/0071249 A1* | 4/2006 | Bluzer et al. .................. 257/288 |
| 2006/0163688 A1* | 7/2006 | Ding et al. ..................... 257/508 |
| 2010/0230822 A1 | 9/2010 | Pagaila et al. |
| 2010/0237386 A1 | 9/2010 | Lin et al. |
| 2010/0264508 A1* | 10/2010 | Stecher et al. ................ 257/503 |
| 2011/0042795 A1* | 2/2011 | Knickerbocker ............. 257/686 |
| 2011/0049594 A1* | 3/2011 | Dyer et al. .................... 257/296 |
| 2011/0139497 A1 | 6/2011 | Li et al. |
| 2011/0140231 A1* | 6/2011 | Farcy et al. .................... 257/508 |
| 2011/0169131 A1* | 7/2011 | Nakos et al. .................. 257/532 |
| 2012/0119275 A1* | 5/2012 | El-Kareh ....................... 257/296 |
| 2012/0199916 A1* | 8/2012 | Oyu .............................. 257/401 |
| 2012/0205777 A1* | 8/2012 | Lee ............................... 257/508 |

OTHER PUBLICATIONS

Duan et al., "A Through-Silicon-Via to Active Device Noise Coupling Study for CMOS SOI Technology" Electrical Components and Technology Conference, IEEE 61st, May 2011. (5 pages).

Khan et al., "Mitigating TSV-Induced Substrate Noise in 3-D ICs using GND Plugs" Proceedings 12th International Symposium on Quality Electronic Design, Mar. 2011. (6 pages).

Knickerboker et al., "Three-Dimensional Silicon Integration" IBM J. Res. & Dev., vol. 52, No. 6, Nov. 2008, pp. 553-569.

* cited by examiner

*Primary Examiner* — Steven J Fulk
(74) *Attorney, Agent, or Firm* — Tutunjian & Bitetto, P.C.; Anne Dougherty

(57) ABSTRACT

Circuits for shielding devices from electromagnetic coupling with through-silicon vias are shown that include a substrate having a through via, which provides access to a device layer on a first surface of the circuit to a device layer on a second surface of the circuit; a conductive layer on the first side of the substrate; a contact point on one of the device layers; and a grounded buried interface tie on the conductive layer, adjacent to the contact point, to isolate the contact point from coupling noise.

19 Claims, 5 Drawing Sheets

THROUGH SILICON VIA NOISE SUPPRESSION USING BURIED INTERFACE CONTACTS

GOVERNMENT RIGHTS

This invention was made with Government support under Contract No.: H98230-07-C-0409 (National Security Agency). The government has certain rights in this invention.

BACKGROUND

1. Technical Field

The present invention relates to techniques for establishing connections for three-dimensional integrated circuits and, in particular, to suppressing substrate noise coupling due to currents on through silicon vias in a three-dimensional integrated circuit.

2. Description of the Related Art

Through silicon via technology (TSV) enables vertical connections for three-dimensional stacked integrated circuits (ICs) and silicon packages. A significant advantage of using TSVs is their small form factor, allowing higher density input/output placement and thereby making possible higher bandwidth and lower-power signaling. Due to the dense distribution of TSVs, however, TSV noise coupling is a significant concern for three-dimensional IC system design, particularly in sensitive applications such as phase-locked loops. Although TSVs are often coated with a dielectric liner to avoid direct current contact to the substrate, thin dielectric layers may not be effective to prevent high-frequency noise penetrating into the substrate.

A circuit is shown that includes a substrate; a conductive layer on the first side of the substrate; a device component above the conductive layer; and a buried interface tie. The substrate includes a through via that provides access to components on a first side of the substrate to components on a second side of the substrate; and a ground via. The buried interface tie is in contact with the conductive layer and connected to the ground via, disposed adjacent to the device component to isolate the device component from coupling noise.

Conventional noise shielding in two-dimensional ICs often use a guard ring structure. The principle of a guard ring is to create a low-impedance path to the ground to capture the substrate coupling noise. In order to achieve effective noise suppression, a guard ring in a three-dimensional IC needs a large width as well as a large separation distance between TSV and the ring. This sacrifices active circuit area and reduces wiring flexibility near the TSV. Furthermore, such guard rings are intended for bulk silicon and the design is not directly applicable to silicon-on-insulator technologies.

SUMMARY

A circuit is shown that includes a substrate having a through via that provides access to a device layer on a first surface of the circuit to a device layer on a second surface of the circuit; a conductive layer on the first side of the substrate; a contact point on one of the device layers; and a grounded buried interface tie on the conductive layer, disposed adjacent to the contact point, to isolate the contact point from coupling noise.

A circuit is shown that includes a substrate. The substrate includes a through via that provides access to a device layer on a first surface of the circuit to a device layer on a second side of the circuit; and a ground via. The circuit further includes a conductive layer on the first side of the substrate; a contact point on one of the device layers; and a buried interface tie in contact with the conductive layer and connected to the ground via, disposed adjacent to the contact point to isolate the contact point from coupling noise.

A three-dimensional circuit is shown that includes a base substrate; and a package on the base substrate that supports one or more circuit stacks. Each circuit stack includes a plurality of circuit layers. At least one of the circuit layers has one or more through vias that provide access to components on a first side of a circuit layer to components on a second side of the circuit layer; a conductive layer on the first side of the circuit layer; a device component above the conductive layer; and a grounded buried interface tie on the conductive layer, disposed adjacent to the device component, to isolate the device component from coupling noise.

A three-dimensional circuit is shown that includes a base substrate; and a package on the base substrate that supports one or more circuit stacks. Each stack includes a plurality of circuit layers, at least one of said circuit layers having one or more through vias that provide access to components on a first side of a circuit layer to components on a second side of the circuit layer; a conductive layer on the first side of the circuit layer; a contact point above the conductive layer; and a grounded buried interface tie on the conductive layer, disposed adjacent to the contact point, to isolate the contact point from coupling noise.

A method for forming a circuit is shown that includes forming a substrate with an active device layer on each side comprising one or more circuit components; forming a through via that penetrates the substrate and connects the active device layer on each side to one another, providing an electrical connection between the at least one circuit components on each side; forming a conductive layer between the substrate and the active device layer; and forming at least one grounded buried interface tie that penetrates the active device layer to contact the conductive layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
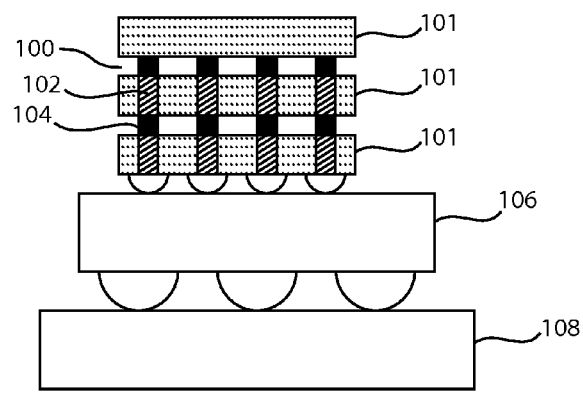
FIG. 1 is a diagram of an exemplary three dimensional circuit having layers connected with through-vias according to the present principles.

The present principles address noise coupling issues between through silicon vias (TSVs) to active devices and deep-trench, capacitor-based memory. The present principles use buried interface tie (BITIE) cells in contact with a substrate beneath an oxide layer to provide sufficient noise isolation. BITIE cells are much more compact in size compared to guard rings and provide greater flexibility for TSV and for floor planning and wiring. The present principles thereby make high-density three-dimensional circuits more practical, as coupling effects are stronger and cause more interference as circuit components are placed closer together. In particular, three-dimensional circuits may be used to build processors, memory, and a wide variety of other devices in such a way as to minimize surface area consumption and also to decrease latency, as vertically stacked circuits can be designed much closer together than two circuits on a two-dimensional surface.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip of photovoltaic device may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). Circuit packages stack circuits vertically, such that the circuit consumes less surface area and improves connectivity between components. In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Referring now to the drawings in which like numerals represent the same or similar elements and initially to FIG. 1, an exemplary three-dimensional integrated circuit 100 (IC) using TSVs is shown. A three-dimensional die stack 100 is formed from a set of circuit layers 101. The circuit layers 101 may be formed from any suitable circuit material such as, e.g., silicon. TSVs 102 run through the circuit layers 101 and are formed from a conductive material such as a metal. By providing vias through the IC 100, TSVs 102 save significant amounts of wiring that would otherwise have run to the edge of the circuit layer 101 to connect to adjoining circuit layers. Furthermore, such edge-wired circuits typically use an additional layer between circuit layers 101, which is rendered entirely unnecessary by the TSVs 102. The circuit layers 101 of die stack 100 may be formed and joined by any suitable technique, including, for example, wafer-on-wafer bonding where circuit layers 101 are formed separately and then aligned and connected to one another. Other technologies include, but are not limited to, die-on-wafer technologies and die-on-die technologies.

The die stack 100 rests on a package 106, which may be formed from, e.g., silicon, and which in turn rests on a base substrate 108. The package 106 may support multiple die stacks 100 and may provide interconnections between said die stacks 100 and the base substrate 108 and may integrate decoupling capacitors. In this way, a three-dimensional structure can be built using stacked integrated circuits and other types of circuits, all working through a common framework (the "package"). The substrate 108 provides mechanical support to the package 106 and provides an additional thermal interface to allow for cooling. The base substrate 108 may be formed from, for example, glass ceramic or low-temperature co-fired ceramic. The circuit layers 101 are connected by, for example, silicon-to-silicon interconnections 114.

TSVs 102 may be formed in the circuit layers 101 by, for example, deep-silicon reactive ion etching and may be formed with one of several cross sections. For example, a TSV may be have a cross section that is cylindrical, annular, coaxial, or rectangular. For the sake of simplicity, only cylindrical TSVs are considered herein. After etching, the hole in circuit layer 101 may be insulated using, for example, a thermal oxide substance such as silicon dioxide. A conductor may be applied in the TSV and may include, for example, copper, tungsten, or a composite. TSVs 102 may be formed by any appropriate process and may vary in size, for example, about 1-90 μm, and may be implemented on circuit layers 102 having a thickness of, for example, about 1-730 μm, with an exemplary thickness of 150 μm. TSVs 102 may be formed using, for example, 45 nm or 22 nm silicon-on-insulator processes or by any other suitable technology. A large number of TSVs 102 may be used on a single circuit layer 101, according to the needs of the given application.

Figure 2:
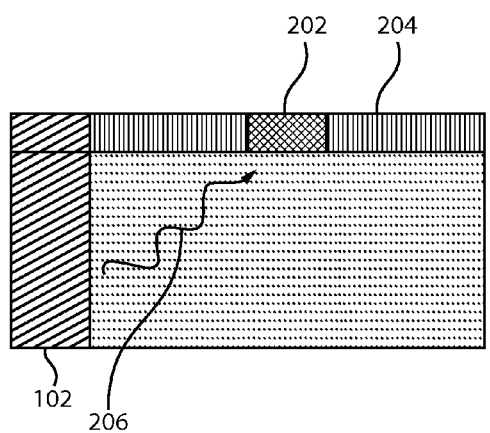
FIG. 2 is a cut-away diagram of a circuit layer showing the coupling of a through-via and a device contact.

Referring now to FIG. 2, an illustration of noise coupling is shown between a TSV 102 and a device contact 202. As a signal passes through TSV 102, the TSV 102 may electromagnetically couple with a device contact 202, introducing noise. The device contact 202 is disposed within an active device layer 204 that may be formed from, e.g., a layer of silicon with different types of doping (for CMOS devices) and/or with an oxide such as silicon dioxide. Alternatively, element 202 may be a deep trench (DT) capacitor associated with, for example, a memory cell.

Figure 3:
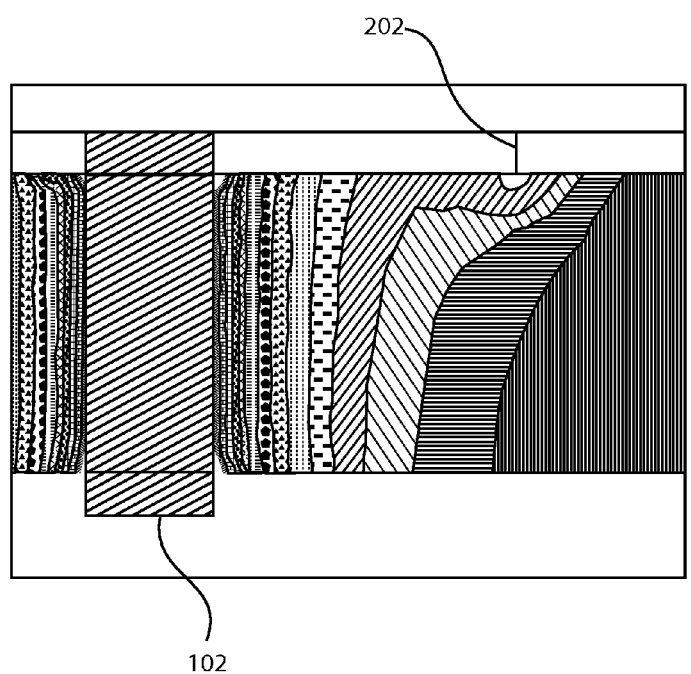
FIG. 3 is a contour diagram showing displacement currents in a circuit layer, illustrating the coupling of a through-via and a device contact.

Referring now to FIG. 3, a qualitative visualization of substrate noise coupling between TSV 102 and device contact 202 is shown in terms of displacement current at 10 GHz. As can be seen from the contours of the figure, relatively strong displacement currents couple the TSV 102 and the contact 202. In particular, a strong current density is visible at the device 202, as the contact behaves as a current-sink, pulling in a significant proportion of the displacement currents excited by the TSV 102, causing the coupling at issue.

Displacement currents are not "true" currents, in that they do not represent the movement of charged particles. Instead, displacement currents are more properly conceived of as time-varying electric fields, which are electromagnetically equivalent to an actual current. In the present case, the electromagnetic fields from TSVs 102 couple with device contact 202 and induce currents therewithin. This is the physical source of the coupling between the TSV 102 and the device contact 202. Thus, coupling will occur unless structures are provided that redirect the displacement currents away from the device contact 202. Electromagnetic coupling can cause substantial noise, particularly when the size of components decreases and the density increases.

Displacement currents are described by Maxwell's generalization of Ampere's law:

$$\nabla \times B = \mu_0 \left( J + \varepsilon_0 \frac{\partial E}{\partial t} \right).$$

In this case, the J term represents a physical current of moving charge, the B term represents the magnetic field, t is time, $\mu_0$ and $\varepsilon_0$ are physical constants, and the E term is an electric field that is changing with time. The changing electrical field within, for example, TSV 102 as it transmits signals, will produce changing magnetic fields which, in turn, create changing electrical fields. These electromagnetic fields in turn will propagate through substrate 101 to cause physical currents at device contact 202.

It should be recognized that, while TSVs are of particular concern with respect to noise coupling, other structures may also produce coupling effects. For example, if a single circuit layer 101 has components on both sides, components on a first side may couple with components on a second side. Additionally, any other device or active connection within the bulk or on the surface of the circuit layer 101 may produce the displacement currents discussed above. As such, the present principles provide noise shielding that is useful in a wide variety of circumstances.

Figure 4:
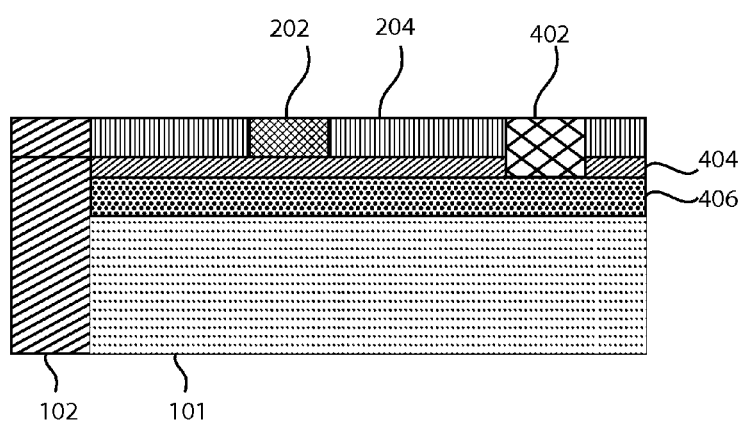
FIG. 4 is a cut-away diagram of an exemplary circuit layer having a conductive layer and a grounded buried interface tie (BITIE) according to the present principles.

Referring now to FIG. 4, an exemplary circuit 400 having a TSV 102 with a BITIE 402 is shown. BITIE cells 402 are inserted adjacent to an active device circuit area 202. In a complementary metal oxide semiconductor (CMOS) silicon-on-insulator (SOI) technology, BITIE cells penetrate the active device layer 204 and a buried oxide insulation layer 404 and are in contact with an underlying silicon substrate 101, making BITIE cells 402 an appropriate solution for devices built using SOI technologies where guard rings would be unavailable. In modern technologies, BITIE cells 402 may be employed to isolate noise coupling from TSV 102, by placing the BITIE cells 402 in contact with a conductive layer 406 above the silicon substrate 101. Any suitable conductive material may be used in the conductive layer 406, though the use of heavily doped n+ silicon is specifically contemplated for compatibility with existing technologies. The conductive layer 406 is insulated from the TSV 102 to prevent electrical leakage.

The nature of conductors is such that dynamic electric fields do not penetrate. When an electromagnetic field impinges upon a conducting surface, the field induces currents within the conductor, drawing charges to the surface. For example, a static electric field pointed into a conducting surface will create a charged area on the surface. The conductor will polarize, negating the field within the conductor and effectively propagating the field on the other side. The presence of a grounding connection, however, allows the conductor to screen out dynamic fields. As the fields change, the conductor will not merely polarize but will draw charges from the ground to compensate. In this manner, the conductive layer 406, grounded by BITIE cell, can provide shielding from displacement currents.

The BITIE cell 402 provides a low-impedance path between the conductive layer 406 and a ground terminal (not shown) to isolate substrate coupling noise. Connection to ground may be accomplished by establishing a grounding TSV 102 in the neighborhood of a signal 102, which the BITIE cells 402 may connect to. The BITIE cells 402 may be short contacts formed from, for example, tungsten, to connect back-end-of-line (BEOL) wiring to the conductive layer 406 under the insulator layer 404. BITIE cells 402 may be formed as partial vias that extend down to an implant region in the doped conductive layer 406, penetrating the insulator layer 404.

Figures 5, 6:
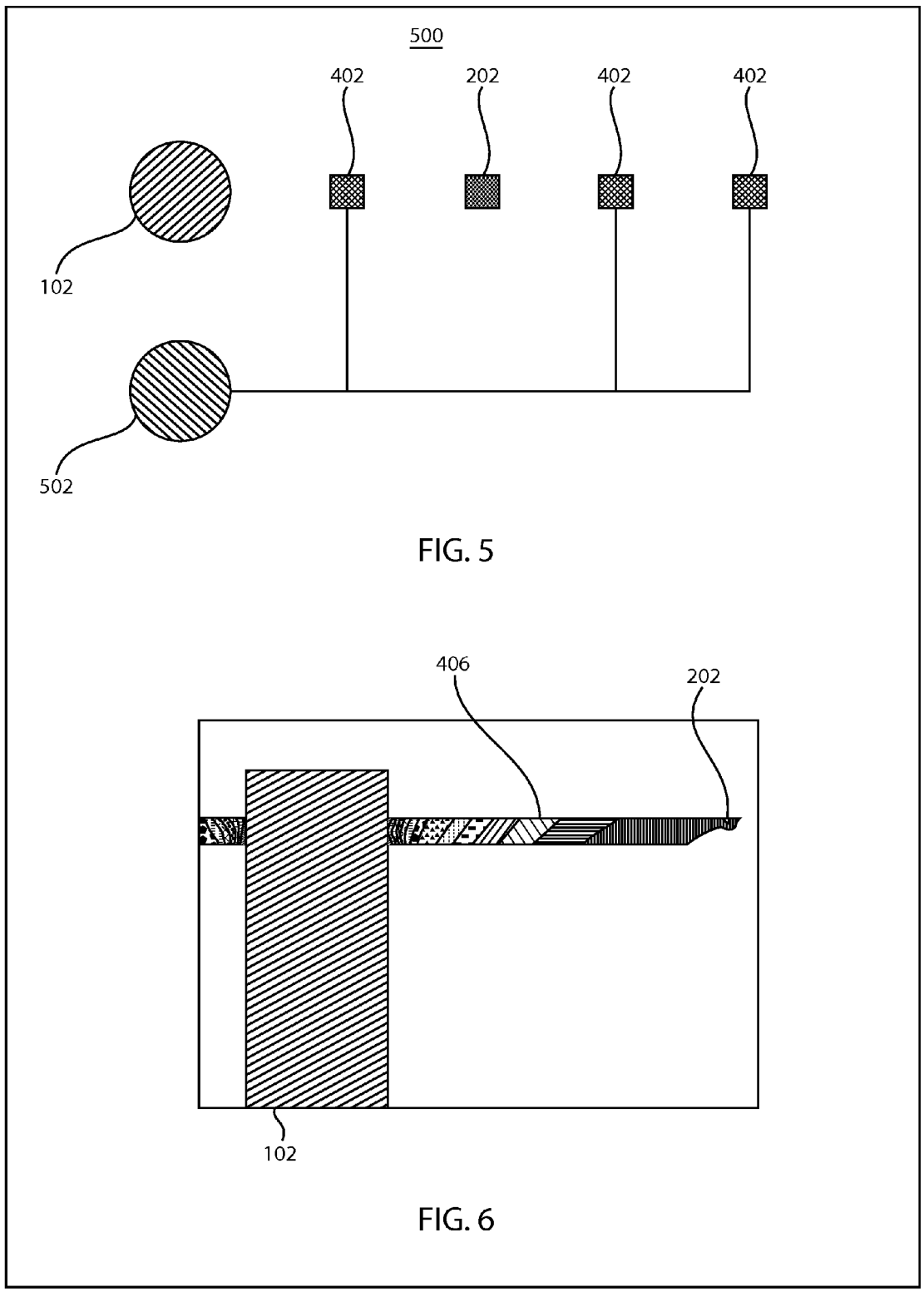
FIG. 5 is a top-down diagram of an exemplary circuit layer having a through-via, a device contact, and a plurality of BITIEs according to the present principles.
FIG. 6 is a contour diagram showing displacement currents being confined to a conductive layer.

Referring now to FIG. 5, a top-down view of an exemplary circuit 500 is shown. A TSV 102 is shown with a nearby device contact or DT capacitor 202. A set of BITIE cells 402 are shown disposed around the device contact 202, providing isolation of the coupling noise. As shown, multiple BITIE cells 402 may be used, including BITIE cells 402 disposed between the TSV 102 and the contact 202 as well as BITIE cells 402 disposed outside the contact 202. A ground via 502 is set in the neighborhood of the TSV 102 and the BITIE cells 402. The BITIE cells 402 may be connected to the ground via 502 through back-end-of-line wiring. The circuit 500 shown may be replicated many times across a single circuit board, providing a high number of through vias 102 while still insulating nearby circuit components from coupling noise.

Referring now to FIG. 6, a qualitative visualization of substrate noise coupling between TSV 102 and device contact 202 is shown with a conductive layer 406 but no BITIE 402. As can be seen from the contours of the figure, the displacements excited by TSV 102 are confined to the conductive layer 406 due to the high level of doping and low resistivity. Highly doped silicon n+ layers, such as 406, are often used to implement integrated deep trench capacitors. In this case, because the conductive layer 406 is not grounded, displacement currents are able to penetrate the conductive layer 406 and cause interference with the device contact 202.

Figure 7:
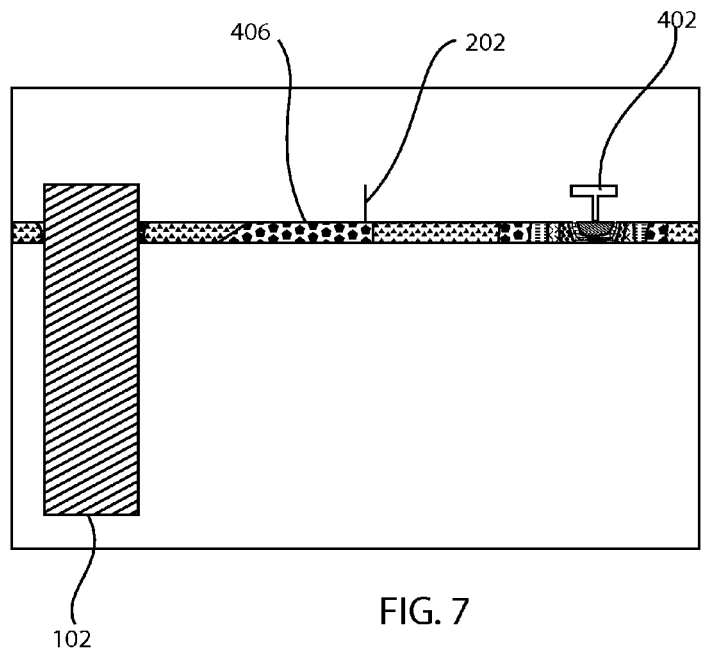
FIG. 7 is a contour diagram showing displacement currents being concentrated at a BITIE, away from a device contact, according to the present principles.

Referring now to FIG. 7, a qualitative visualization of substrate noise coupling between TSV 102 and device contact 202 is shown with a conductive layer 406 and a BITIE 402. The presence of BITIE 402 concentrates the displacement current away from the contact 202, preventing noise coupling from interfering with the device contact 202. By confining displacement currents to the conductive layer 406, the present principles make it possible for the BITIE 402 to draw displacement currents into an area that will not interfere with operation of contact 202.

Figure 8:
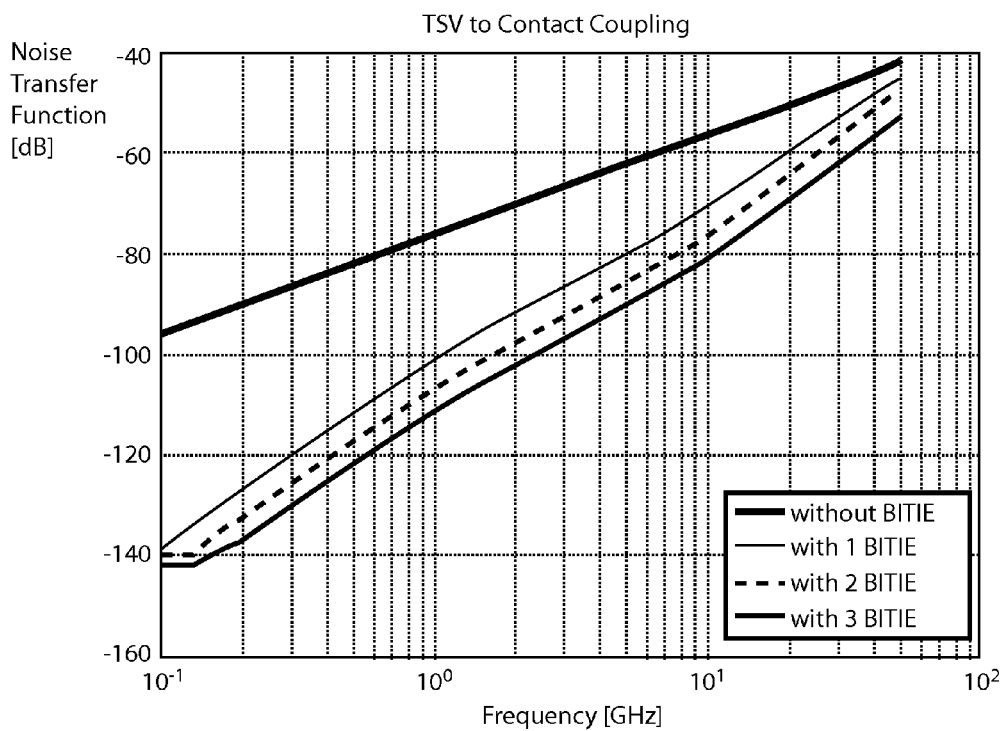
FIG. 8 is a graph showing an advantageous decrease in coupling effects based on the use of BITIEs according to the present principles.

Referring now to FIG. 8, a comparison of noise transfer functions for four configurations is shown. The graph plots noise transfer function in decibels against frequency in gigahertz, showing a substantial reduction in noise with one, two or three BITIEs 402 as compared to no BITIE. This graph is provided to show the coupling between a TSV 102 and a device contact 202. Similar improvements are obtained in embodiments using deep trench capacitors.

Figure 9:
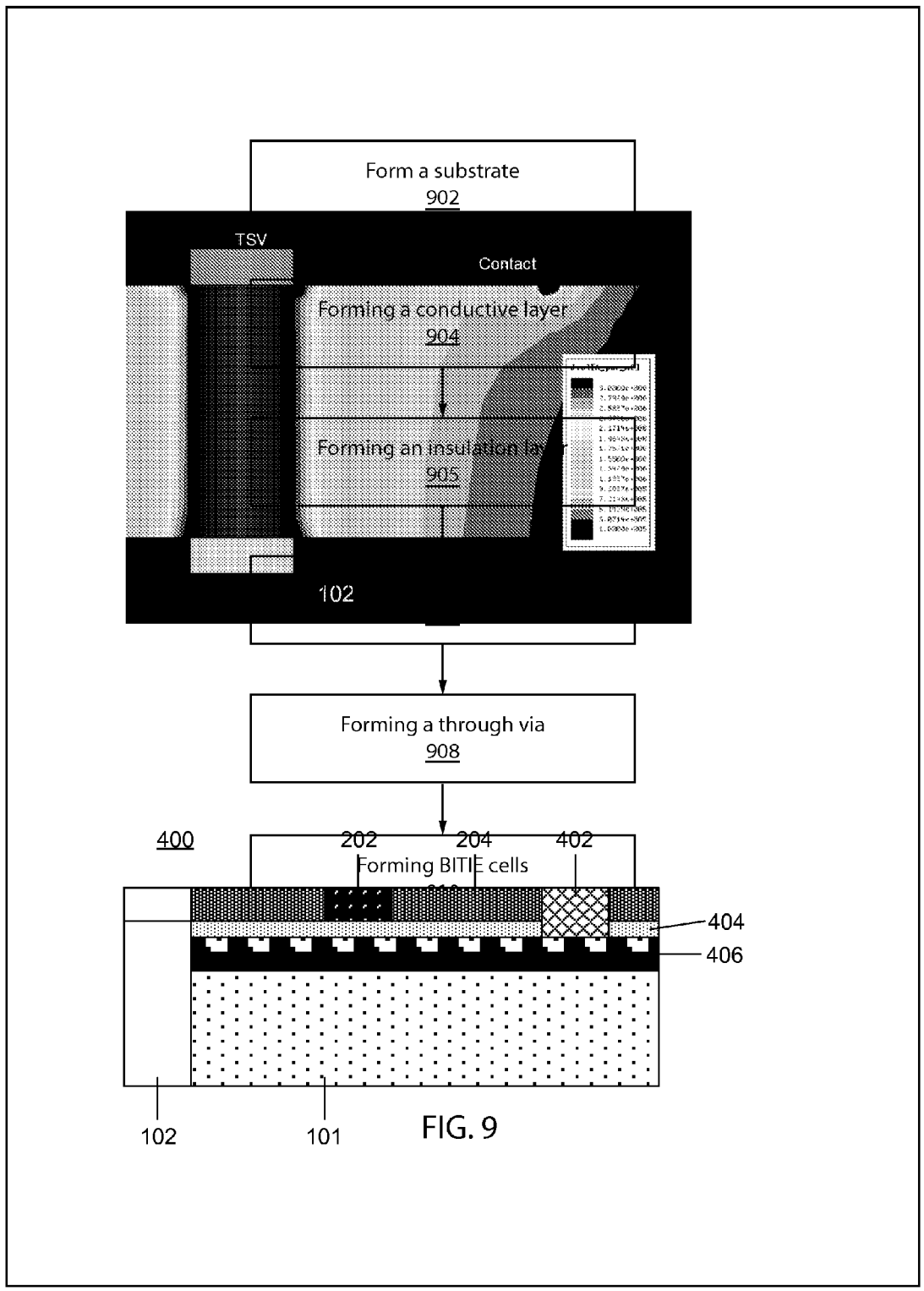
FIG. 9 is a block/flow diagram showing an exemplary method for providing noise suppression using BITIEs according to the present principles.

Referring now to FIG. 9, an exemplary method for the formation of a circuit layer according to the present principles is shown. At block 902, a substrate is formed from, e.g., silicon. The substrate 101 may be formed from any suitable process, including for example epitaxial crystal growth and planing. Block 904 then forms a conductive layer 406 on each side of the substrate 101, for example by doping the top layer of the substrate as described above. Block 905 forms an insulation layer 404 on each side that may comprise a dielectric, such as silicon dioxide. Block 906 forms an active device layer 204 on each side that includes one or more circuit components 202 on the surface of the circuit. Block 908 forms a through via in the circuit layer that penetrates the active device layer 204, the insulation layer 404, the conductive layer 406, and the substrate 101, to provide electrical contact between an active layer 204 on each side of the substrate 101. Block 910 forms BITIE cells 402 to provide grounding to the conductive layer 406 and to shield the circuit components 202 from coupling noise.

Having described preferred embodiments of TSV noise suppression using buried interface contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A circuit, comprising:
 a substrate having a through via that provides access to a device layer on a first surface of the circuit to a device layer on a second surface of the circuit;
 a conductive layer on a first surface of the substrate;
 a contact point on one of the device layers; and
 a plurality of grounded buried interface ties on the conductive layer, disposed adjacent to the contact point on a side of the contact point opposite the through via, to isolate the contact point from coupling noise from the through via, wherein the plurality of buried interface ties are disposed at varying distances from the through via and are collinear with the contact point.

2. The circuit of claim 1, further comprising an insulation layer between the conductive layer and the device layer on a same side of the circuit.

3. The circuit of claim 2, wherein the grounded buried interface tie penetrates the insulation layer to contact the conductive layer.

4. The circuit of claim 2, wherein the insulation layer is formed from silicon dioxide.

5. The circuit of claim 1, wherein the device layer includes a deep-trench capacitor at the contact point.

6. The circuit of claim 1, wherein the conductive layer is formed from heavily doped n+ silicon.

7. A circuit, comprising:
 a substrate comprising:
  a through via that provides access to a device layer on a first surface of the circuit to a device layer on a second side of the circuit; and
  a ground via;
 a conductive layer on a first surface of the substrate;
 a contact point on one of the device layers; and
 a plurality of buried interface ties in contact with the conductive layer and connected to the ground via, disposed adjacent to the contact point on a side of the contact point opposite the through via to isolate the contact point from coupling noise from the through via, wherein the plurality of buried interface ties are disposed at varying distances from the through via and are collinear with the contact point.

8. The circuit of claim 7, further comprising an insulation layer between the conductive layer and the device layer on a same side of the circuit, wherein the grounded buried interface tie penetrates the insulation layer to contact the conductive layer.

9. A three-dimensional circuit, comprising:
 a base substrate; and
 a package on the base substrate that supports one or more circuit stacks, each stack comprising:
  a plurality of circuit layers, at least one of said circuit layers having one or more through vias that provide access to components on a first surface of a circuit layer to components on a second surface of the circuit layer;
  a conductive layer on the first surface of the circuit layer;
  a contact point above the conductive layer; and
  a plurality of grounded buried interface ties on the conductive layer, disposed adjacent to the contact point on a side of the contact point opposite the through via, to isolate the contact point from coupling noise from the through via, wherein the plurality of buried interface ties are disposed at varying distances from the through via and are collinear with the contact point.

10. The three-dimensional circuit of claim 9, further comprising an insulation layer between the conductive layer and the device layer.

11. The three-dimensional circuit of claim 10, wherein the grounded buried interface tie penetrates the insulation layer to contact the conductive layer.

12. The three-dimensional circuit of claim 10, wherein the insulation layer is formed from silicon dioxide.

13. The three-dimensional circuit of claim 9, wherein the device layer includes a deep-trench capacitor at the contact point.

14. The three-dimensional circuit of claim 9, wherein the conductive layer is formed from heavily doped n+ silicon.

15. The three-dimensional circuit of claim 9, wherein the base substrate comprises a ceramic.

16. A method for forming a circuit, comprising:
 forming a substrate with an active device layer on each side comprising at least one contact point;
 forming a through via that penetrates the substrate and connects the active device layer on each side to one another, providing an electrical connection between the active device layers on each side;
 forming a conductive layer on a surface of the substrate, between the substrate and the active device layer; and
 forming a plurality of grounded buried interface ties that penetrate the active device layer to contact the conductive layer at varying distances from the through via on a side of the contact point opposite the through via, said plurality of grounded buried interface ties being formed collinear with the contact point.

17. The method of claim 16, further comprising forming an insulation layer between the conductive layer and the active device layer.

18. The method of claim 17, wherein the grounded buried interface tie penetrates the insulation layer to contact the conductive layer.

19. The method of claim 16, wherein the conductive layer is formed from heavily doped n+ silicon.

* * * * *